(12) United States Patent
Jongman et al.

(10) Patent No.: US 11,508,923 B2
(45) Date of Patent: Nov. 22, 2022

(54) SEMICONDUCTOR DEVICES

(71) Applicant: Flexenable Limited, Cambridge (GB)

(72) Inventors: Jan Jongman, Cambridge (GB); Brian Asplin, Cambridge (GB)

(73) Assignee: Flexenable Limited, Cambridge (GB)

( * ) Notice: Subject to any disclaimer, the term of this patent is extended or adjusted under 35 U.S.C. 154(b) by 0 days.

(21) Appl. No.: 17/123,646

(22) Filed: Dec. 16, 2020

(65) Prior Publication Data

US 2021/0184144 A1 Jun. 17, 2021

(30) Foreign Application Priority Data

Dec. 17, 2019 (GB) ..................................... 1918631

(51) Int. Cl.
*H01L 51/10* (2006.01)
*H01L 27/28* (2006.01)
(Continued)

(52) U.S. Cl.
CPC .......... *H01L 51/10* (2013.01); *H01L 21/0274* (2013.01); *H01L 27/1244* (2013.01); *H01L 27/283* (2013.01); *H01L 29/78633* (2013.01); *H01L 51/0018* (2013.01); *H01L 51/0023* (2013.01); *H01L 51/055* (2013.01);
(Continued)

(58) Field of Classification Search
CPC ..... H01L 51/10; H01L 27/283; H01L 51/055; H01L 51/0558; H01L 51/107; H01L 27/3272; H01L 27/3274; H01L 51/0017; H01L 27/1244; H01L 21/0274; H01L 29/78633; H01L 51/0018; H01L 51/0023; G02F 1/1368
See application file for complete search history.

(56) References Cited

U.S. PATENT DOCUMENTS 6,987,311 B2 * 1/2006 Yang ................... H01L 27/1288
257/E21.414
2003/0232456 A1 12/2003 Yang et al.
(Continued)

FOREIGN PATENT DOCUMENTS

GB 2548357 * 9/2017
KR 2007-0071179 * 7/2007
(Continued)

OTHER PUBLICATIONS

Search Report from Great Britain Patent Application No. 1918631.1, dated Jun. 12, 2020.

*Primary Examiner* — Ahmed N Sefer
(74) *Attorney, Agent, or Firm* — Dergosits & Noah LLP; Todd A. Noah (57) ABSTRACT

A technique, comprising: forming in situ on a support substrate: a first metal layer; a light-absorbing layer after the first metal layer; a conductor pattern after the light-absorbing layer; and a semiconductor layer after the conductor pattern; patterning the semiconductor layer using a resist mask to form a semiconductor pattern defining one or more semiconductor channels of one or more semiconductor devices; and patterning the light-absorbing layer using the resist mask and the conductor pattern, so as to selectively retain the light-absorbing layer in regions that are occupied by at least one of the resist mask and the conductor pattern.

20 Claims, 7 Drawing Sheets

(51) Int. Cl.
*H01L 51/05* (2006.01)
*H01L 27/12* (2006.01)
*H01L 29/786* (2006.01)
*H01L 51/00* (2006.01)
*H01L 21/027* (2006.01)
*H01L 27/32* (2006.01)

(52) U.S. Cl.
CPC ........ H01L 51/0558 (2013.01); H01L 51/107 (2013.01); *H01L 27/3272* (2013.01); *H01L 27/3274* (2013.01); *H01L 51/0017* (2013.01)

(56) References Cited

U.S. PATENT DOCUMENTS

| | | | | |
|---|---|---|---|---|
| 2010/0271353 | A1* | 10/2010 | Yoneya | H01L 27/283 345/206 |
| 2016/0011457 | A1* | 1/2016 | Zhang | H01L 27/1288 438/29 |
| 2016/0233291 | A1* | 8/2016 | Lim | H01L 27/1259 |
| 2017/0236850 | A1* | 8/2017 | Norval | H01L 27/1288 438/155 |
| 2018/0149933 | A1 | 5/2018 | Wang | |
| 2018/0149935 | A1* | 5/2018 | Lee | G02F 1/136 |
| 2019/0324309 | A1* | 10/2019 | Tominaga | G06F 3/0445 |
| 2020/0006406 | A1* | 1/2020 | Song | H01L 29/4908 |
| 2021/0167156 | A1* | 6/2021 | Sun | H01L 27/3272 |
| 2021/0328072 | A1* | 10/2021 | Ma | H01L 21/77 |

FOREIGN PATENT DOCUMENTS

| | | | |
|---|---|---|---|
| KR | 1020180040005 A | 4/2018 | |
| WO | WO-2008038588 A1 * | 4/2008 | ......... H01L 51/0016 |
| WO | 2019184318 A1 | 10/2019 | |

* cited by examiner

SEMICONDUCTOR DEVICES

CLAIM OF PRIORITY

This application claims priority to Great Britain Patent Application No. 1918631.1, dated Dec. 17, 2019.

FIELD OF THE INVENTION

Some semiconductor materials are sensitive to white light, and the design of semiconductor devices including such materials can involve incorporating elements within the devices to shield the semiconductor channels from white light.

An array of semiconductor devices can be defined by a stack of conductor, semiconductor and insulator layers on a support substrate, and one technique of shielding the semiconductor channels from white light involves including within the stack between the support substrate and the semiconductor layer a patterned metal layer whose primary function is to shield the semiconductor channels by reflecting white light incident upon the support substrate from the side opposite to the stack of layers.

The inventor for the present application has conducted further research into protecting the semiconductor channels from white light.

There is hereby provided a method, comprising: forming in situ on a support substrate: a first metal layer; a light-absorbing layer after the first metal layer; a conductor pattern after the light-absorbing layer; and a semiconductor layer after the conductor pattern; patterning the semiconductor layer using a resist mask to form a semiconductor pattern defining one or more semiconductor channels of one or more semiconductor devices; and patterning the light-absorbing layer using the resist mask and the conductor pattern, so as to selectively retain the light-absorbing layer in regions that are occupied by at least one of the resist mask and the conductor pattern.

According to one embodiment, the light-absorbing layer exhibits a white light optical density (in a direction substantially perpendicular to the plane of the support substrate) of at least about 1, and a white light total reflectance of no more than about 10%.

According to one embodiment, the light-absorbing layer comprises an insulator material, preferably having a sheet resistance of greater than 1 MOhm/square.

According to one embodiment, the light-absorbing layer is separated from the semiconductor layer by a distance (in a direction substantially perpendicular to the plane of the support substrate) of no more than about 500 nm.

According to one embodiment, the light-absorbing layer interfaces with the one or more semiconductor channels.

According to one embodiment, the first metal layer is a light-shielding metal pattern.

According to one embodiment, the one or more semiconductor devices form part of a control component half-cell for a liquid crystal cell comprising liquid crystal material between the control component half-cell and another half-cell comprising an array of colour filters in a black matrix.

There is also hereby provided a device comprising: a stack of layers defining one or more semiconductor devices; wherein the stack comprises: a semiconductor layer defining one or more semiconductor channels of the one or more semiconductor devices; a first metal layer below the semiconductor layer and a second metal layer above the semiconductor layer; a conductor pattern between the first metal layer and the semiconductor layer; and a light-absorbing pattern between the first metal layer and the conductor pattern; wherein the light-absorbing pattern has edges that align with edges of the conductor pattern.

According to one embodiment, the light-absorbing pattern exhibits a white light optical density (in a direction substantially perpendicular to the plane of the stack) of at least about 1, and a white light total reflectance of no more than about 10%.

According to one embodiment, the light-absorbing pattern comprises an insulator material, preferably having a sheet resistance of greater than 1 MOhm/square.

According to one embodiment, the light-absorbing pattern is separated from the semiconductor layer by a distance (in a direction substantially perpendicular to the plane of the stack) of no more than about 500 nm.

According to one embodiment, the light-absorbing pattern interfaces with the one or more semiconductor channels.

According to one embodiment, the first metal layer comprises a light-shielding metal pattern.

According to one embodiment, the one or more semiconductor devices form part of a control component half-cell for a liquid crystal cell comprising liquid crystal material between the control component half-cell and another half-cell comprising an array of colour filters in a black matrix.

There is also hereby provided a device comprising: a stack of layers defining one or more transistor devices; wherein the stack comprises: a semiconductor layer defining one or more semiconductor channels of the one or more transistor devices; a metal layer above the semiconductor layer; and a light-absorbing pattern between the semiconductor layer and the metal layer.

According to one embodiment, the light-absorbing pattern exhibits a white light optical density (in a direction substantially perpendicular to the plane of the stack) of at least about 1, and a white light total reflectance of no more than about 10%.

According to one embodiment, the light-absorbing pattern comprises an insulator material, preferably having a sheet resistance of greater than 1 MOhm/square.

According to one embodiment, the metal layer defines gate tracking for the one or more transistor devices.

According to one embodiment, the one or more transistor devices form part of a control component half-cell for a liquid crystal cell comprising liquid crystal material between the control component half-cell and another half-cell comprising an array of colour filters in a black matrix.

There is also hereby provided a device comprising: a stack of layers defining one or more semiconductor devices; wherein the stack comprises: a semiconductor layer defining one or more semiconductor channels of the one or more semiconductor devices; metal layers above and below the semiconductor layer; and one or more patterned, light-absorbing layers between the metal layers.

There is also hereby provided a method, comprising: forming in situ on a support substrate a stack of layers defining one or more semiconductor devices; wherein the stack comprises: a patterned semiconductor layer defining one or more semiconductor channels of the one or more semiconductor devices; metal layers above and below the semiconductor layer; and one or more patterned, light-absorbing layers between the metal layers; wherein the method comprises patterning at least one of the one or more patterned, light-absorbing layers using a resist mask used to also pattern the semiconductor layer.

BRIEF DESCRIPTION OF THE FIGURES

Example embodiments are described in detail hereunder, by way of example only, with reference to the accompanying drawings, in which:

FIGS. 2-16 illustrate an example technique according to a second embodiment.

DETAILED DESCRIPTION

Embodiments are described below for the example of the production of an organic liquid crystal display (OLCD) device, which comprises an organic transistor device (such as an organic thin film transistor (OTFT) device) for the control component. OTFTs comprise an organic semiconductor (such as e.g. an organic polymer or small-molecule semiconductor) for the semiconductor channels. However, the techniques are also applicable to the production of other kinds of devices including light-sensitive semiconductors, such as other kinds of display devices (e.g. electrophoretic display (EPD devices) and non-display devices such as adaptive lenses and sensor devices.

First Example Embodiment

Figure 1:
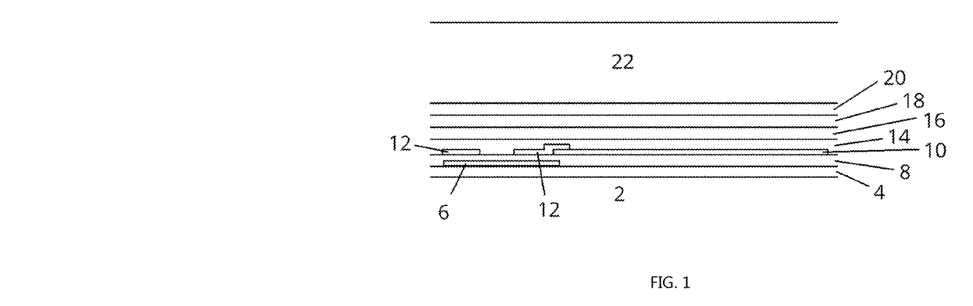
FIGS. 1-11 illustrate an example technique according to a first embodiment.

With reference to FIG. 1, the description of a technique according to a first example embodiment begins with a workpiece comprising a support substrate 2 (e.g., an optically neutral, plastics support film such as a cellulose triacetate (TAC) film) and an initial set of layers formed in situ on the support substrate 2. The initial set of layers includes, in sequence: (i) a planarisation layer 4, such as a layer of a cross-linked organic polymer such as the epoxy-based polymer known as SU-8; (ii) a 1st metal pattern 6 (comprising a patterned metal layer or a patterned sub-stack of metal layers), whose primary function is to shield the semiconductor channels by reflecting white light incident on the support substrate from the opposite side (bottom side in the drawings) of the support substrate; (iii) another planarisation layer 8, e.g., having the same composition as the first planarisation layer; (iv) an electrically conductive metal oxide pattern 10 (e.g., indium-tin-oxide (ITO)), which provides an array of pixel electrodes for the device; (v) a 2nd metal pattern 12 (comprising a patterned metal layer or a patterned sub-stack of metal layers) defining at least the source and drain conductors for an array of thin-film-transistor (TFT) devices; (vi) an unpatterned semiconductor layer 14 (e.g., organic polymer semiconductor layer) that provides the semiconductor channels for the thin-film-transistor (TFT) devices; (vii) an unpatterned gate dielectric layer 16 (e.g., a low-k, non-cross-linked organic polymer insulator layer or, e.g., a stack comprising a low-k, non-cross-linked organic polymer insulator sub-layer and an overlying high-k organic polymer insulator (cross-linked or non-cross-linked) sub-layer (k=dielectric constant)) interfacing the semiconductor layer; (viii) an unpatterned, electrically conductive metal oxide layer 18 (e.g., indium-tin-oxide (ITO)), which provides the gate electrodes for the thin-film-transistor (TFT) devices (and, as mentioned further below, also acts as a dry etch-stop in a later patterning process); (ix) an unpatterned layer of light-absorbing material 20 whose primary function is to absorb any scattered white light that happens to be propagating within the stack in a direction substantially parallel to the plane of the stack; and (x) an unpatterned photoresist layer 22.

Figure 2:
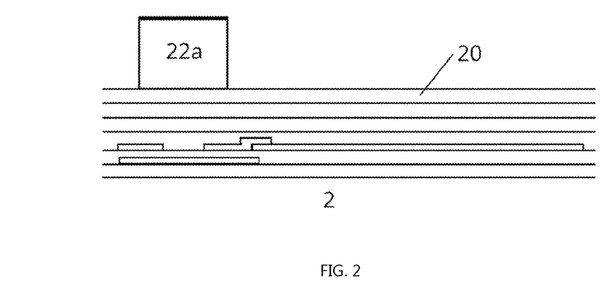

With reference to FIG. 2, the photoresist layer 22 is patterned by photolithography, as follows. The upper surface of the workpiece is exposed to a radiation image (positive or negative, depending on the type of photoresist being used) of the pattern desired for the photoresist layer. The radiation is of a frequency that induces a change in the solubility of the photoresist material. The resulting latent solubility image is developed to produce a physical pattern 22a in the photoresist layer.

Figure 3:
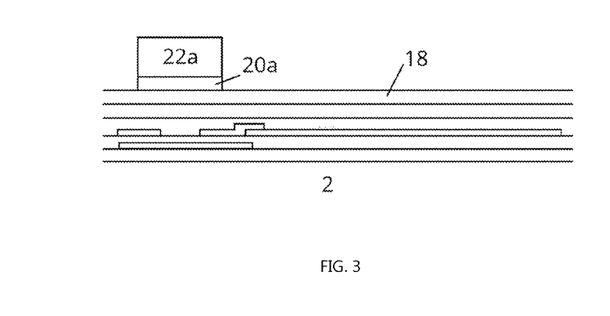

With reference to FIG. 3, the resulting workpiece is then subjected to a dry etching treatment (reactive ion etching (RIE) treatment) that etches the exposed portions of the cross-linked polymer absorbing layer 20. The underlying metal oxide layer 18 is resistant to the dry etching treatment, and the etching stops at the metal oxide layer 18.

Figure 4:
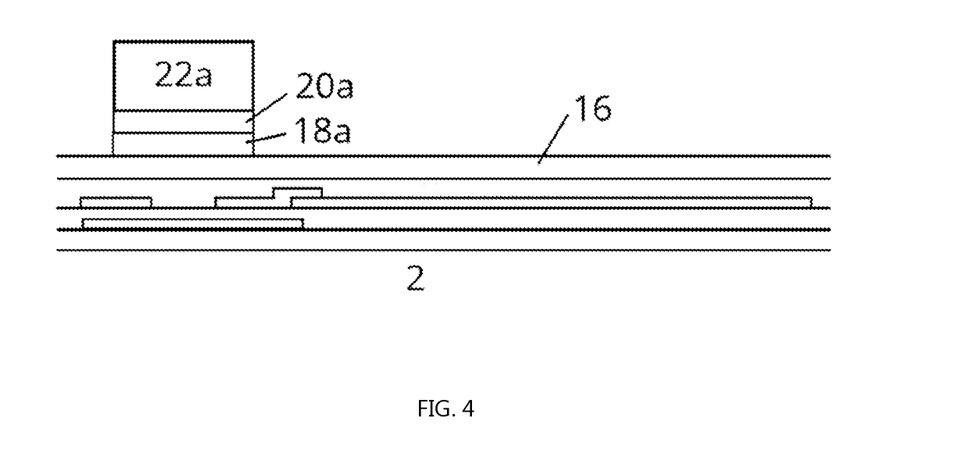

With reference to FIG. 4, the resulting workpiece is then subjected to a wet etching treatment that etches the ITO layer 18, using the photoresist pattern 22a as an etching mask. The underlying gate dielectric layer 16 is resistant to this wet etching treatment; and the wet etching stops at this layer 16. In one example variation, this wet etching treatment is replaced with a dry etching treatment using gases that create plasma species that are significantly more chemically reactive with the ITO layer 18 than with the underlying gate dielectric layer 16.

Figure 5:
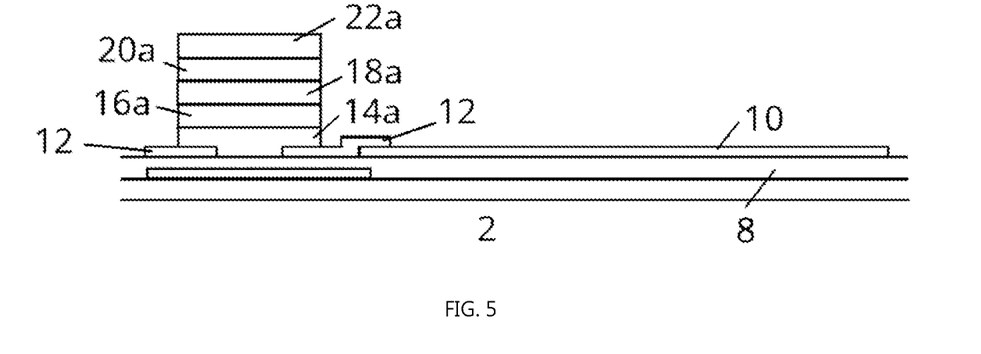

With reference to FIG. 5, the workpiece is subject to further dry etching (RIE) without removing the photoresist pattern 22a, but one alternative option is to first remove the photoresist pattern 22a, and rely on the patterned metal oxide layer 18a as an etching mask for patterning the organic dielectric layer(s) 16 and semiconductor layer 14 by dry etching. The 2nd metal pattern (source-drain pattern) 12, the pixel electrode metal oxide pattern 10 and the upper planarisation layer 8 are resistant to this dry etching, and the dry etching stops at these patterns/layer. The light-absorbing material 20 thus remains, after patterning, in at least the regions of the semiconductor channels.

Figure 6:
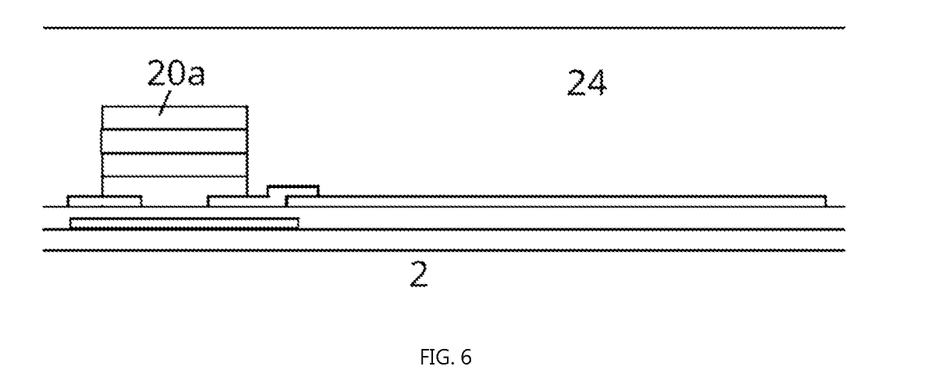

With reference to FIG. 6, the photoresist pattern 22a is then removed, and an organic polymer insulator layer 24 (e.g., cross-linked polymer layer) is formed in situ on the working surface of the workpiece, so as to fully cover the underlying patterns.

Figure 7:
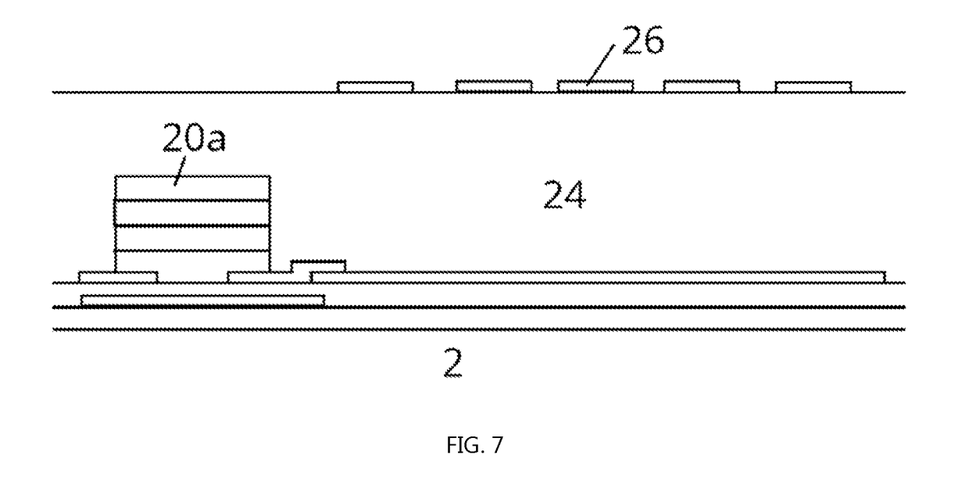

With reference to FIG. 7, another layer of conductive metal oxide (e.g., ITO) is formed in situ on the working surface of the workpiece, and patterned using a patterned photoresist mask (not shown) and wet etching to provide a counter electrode 26 (COM electrode) for each pixel electrode. The underlying organic polymer insulator layer 24 is resistant to this wet etching, and the wet etching stops at this organic polymer insulator layer 24. The photoresist mask is thereafter removed.

Figure 8:
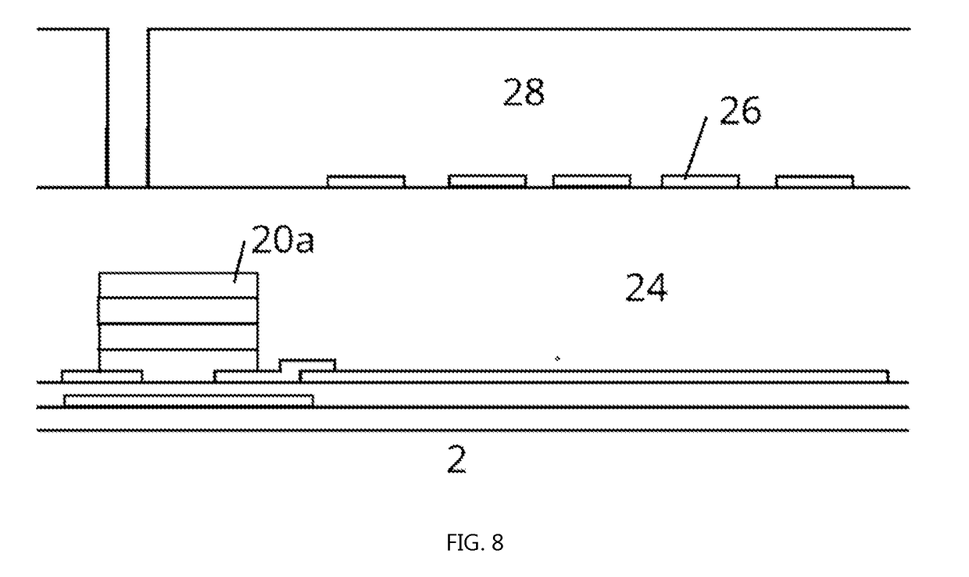

With reference to FIG. 8, a new layer of photoresist material 28 is formed in situ on the working surface of the workpiece, and patterned to create a photoresist mask for patterning of the underlying insulator layer 24 and light-absorbing layer 20 to create at least interconnection vias (ICVs) down to the conductive metal oxide, gate electrode islands 18a. In this example, the patterning also creates ICVs outside the active display area down to gate routing conductors (not shown) defined by the second metal pattern 12.

Figure 9:
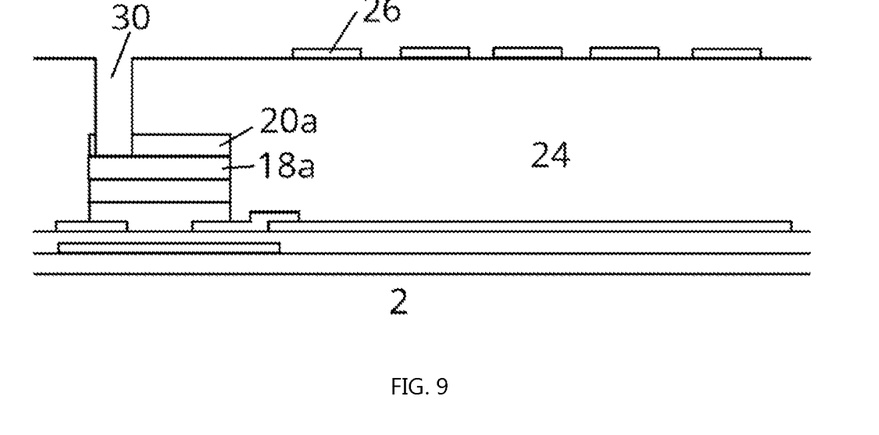

With reference to FIG. 9, the workpiece is thereafter subjected to dry etching (RIE). The metal oxide islands 18a are resistant to the dry etching, and the dry etching stops at these metal oxide islands 18a, to leave ICVs down to the metal oxide gate electrode 18a for each TFT. The photoresist mask 28 is thereafter removed.

Figure 10:
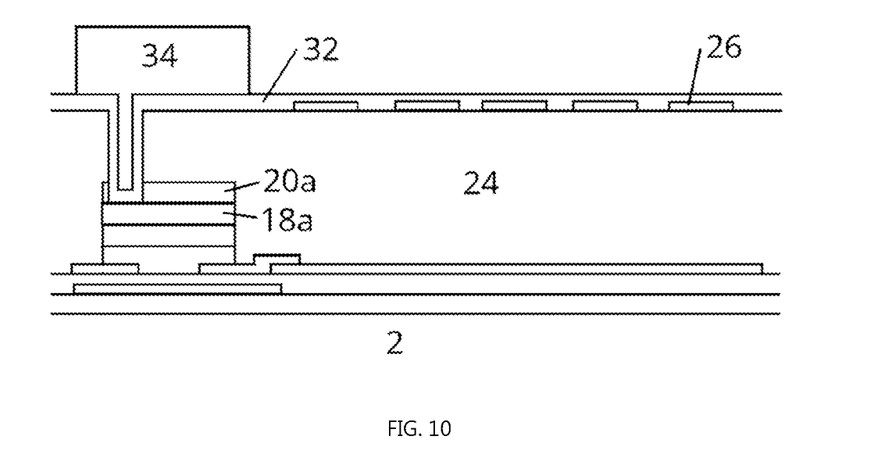
Figure 11:
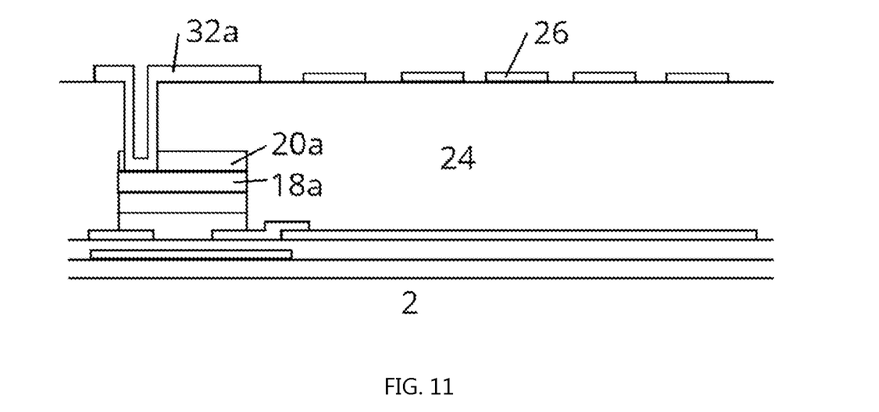

With reference to FIGS. 10 and 11, a 3rd metal pattern 32a is formed in situ on the upper surface of the workpiece, to provide tracking for addressing the gate electrodes of the TFTs. A metal layer 32 (or a sub-stack of metal layers) is formed in situ on the working surface of the workpiece by, e.g., a vapour deposition technique such as sputtering. This metal layer/sub-stack 32 contacts the metal oxide gate electrodes 18a via the ICVs through the insulator layer 24 and light-absorbing layer 20. This metal layer/sub-stack 32 also contacts the gate routing conductors (not shown) via the above-mentioned extra ICVs outside the active display area. A layer of photoresist material is thereafter formed in situ on the workpiece (FIG. 10). The layer of photoresist is then patterned to create a photoresist mask 34 for patterning the metal layer 32; and the workpiece is subject to a wet etching treatment. The wet etching treatment etches the one or more metal layers 32 in regions exposed by the photoresist mask. The organic polymer insulator 24 and the metal oxide common electrode pattern 18a are resistant to this wet etching treatment, and the wet etching stops at these layers. This patterning creates conductive tracking for addressing the metal oxide gate electrodes 18a (FIG. 11). The photoresist mask is thereafter removed.

In this example, the conductive tracking (for the gate electrodes) comprises an array of conductor lines, each connected to the gate electrodes of a respective row of TFTs, each extending to outside the active area occupied by the array of pixel electrodes and each in contact with a respective routing conductor (not shown) defined by the 2nd metal pattern via a respective one of the above-mentioned ICVs outside the active area. The source/drain metal pattern also comprises an array of source conductor lines, each providing the source electrodes for a respective column of TFTs and extending to outside the active area occupied by the array of pixel electrodes. Each TFT is associated with a respective, unique combination of source conductor line and gate tracking conductive line, whereby each pixel electrode can be addressed independently of all other pixel electrodes, via conductors outside the active area.

Second Example Embodiment

A second example embodiment of a technique according to the present invention is shown in FIGS. 12-16.

Figure 12:
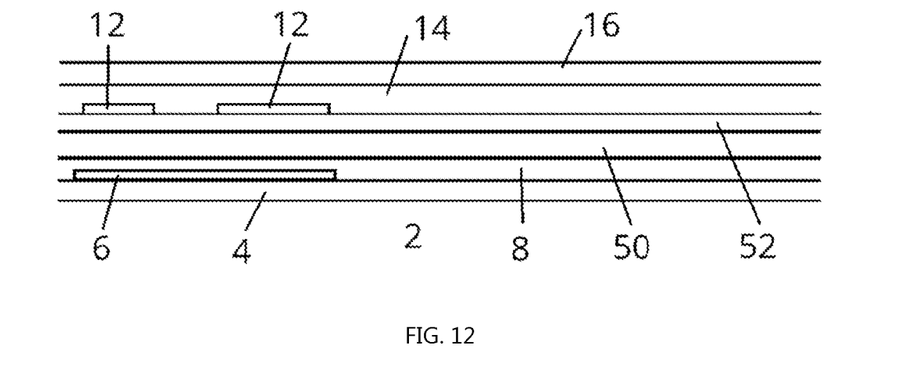

With reference to FIG. 12, the description of this second example embodiment begins with a workpiece comprising: a support substrate 2 (e.g., optically neutral organic polymer film such as a TAC film), and an initial set of layers formed in situ on the support substrate. The set of initial layers include, in sequence: (i) a planarisation layer 4, such as a layer of a cross-linked organic polymer such as the epoxy-based polymer known as SU-8; (ii) a 1st metal pattern 6 (comprising a patterned metal layer or a patterned sub-stack of metal layers) whose primary function is to shield the semiconductor channels by reflecting white light incident on the support substrate from the opposite side (bottom side in the drawings) of the support substrate; (iii) another planarisation layer 8 (e.g., having the same composition as the first planarisation layer); (iv) an unpatterned layer of light-absorbing material 50, whose primary function is to absorb any scattered white light that happens to be propagating within the stack in a direction substantially parallel to the plane of the stack; (v) an unpatterned layer of insulator material 52 (referred to here as a back channel dielectric layer because it interfaces with the semiconductor channels) such as a layer of the same material as the above-mentioned planarisation layers, or another organic polymer insulator material; (vi) a 2nd metal pattern 12 (comprising a patterned metal layer or a patterned sub-stack of metal layers) defining at least the source and drain conductors for an array of thin-film-transistor (TFT) devices; (vii) an unpatterned semiconductor layer 14 (e.g., organic polymer semiconductor layer) that provides the semiconductor channels for the thin-film-transistor (TFT) devices; and (viii) an unpatterned, first gate dielectric layer 16 (e.g., organic polymer insulator layer) interfacing the semiconductor layer.

The back channel dielectric layer 52 has a thickness of no more than about 500 nm so as to bring the light-absorbing layer 50 close to the semiconductor channels. The back channel dielectric layer 52 facilitates the selection of a light-absorbing material for the light-absorbing layer 50 without having to being concerned about electrical conductivity or chemical compatibility with the semiconductor material 14.

Figure 13:
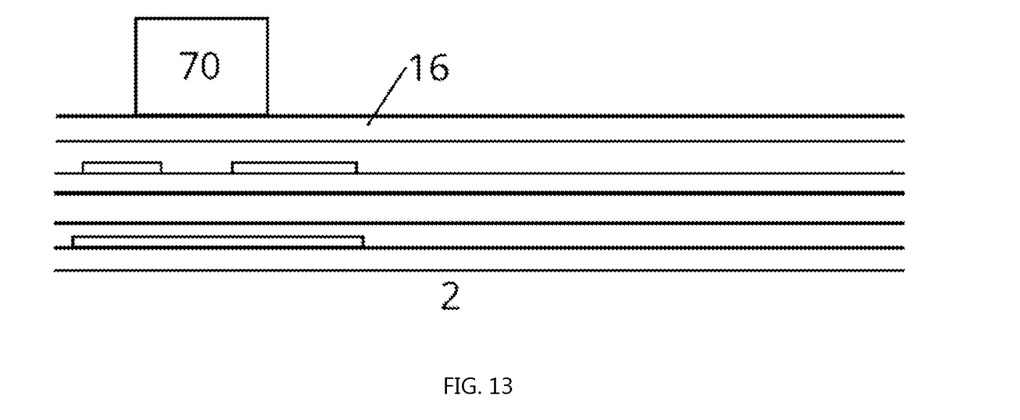

With reference to FIG. 13, a layer of photoresist material is formed in situ on the working surface of the workpiece, over the first gate dielectric layer 16. The layer of photoresist material is exposed to an image (negative or positive, depending on the type of photoresist material used) of the pattern desired for the semiconductor and first gate dielectric layers, using radiation at a frequency that induces a change in the solubility of the photoresist material. The resulting latent solubility image is developed to create a physical pattern 70 in the photoresist layer.

Figure 14:
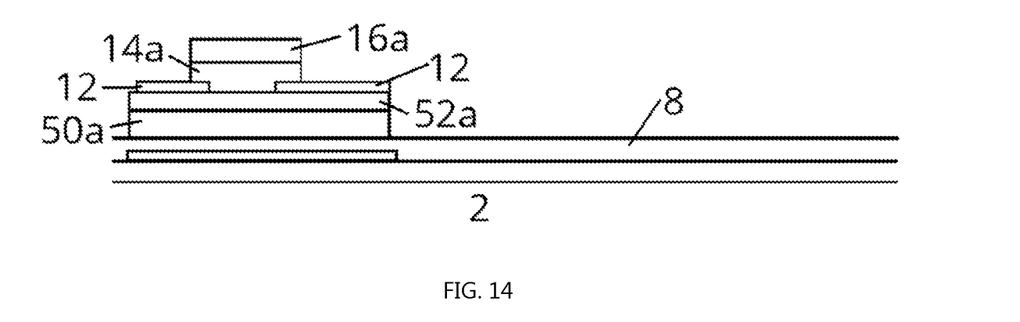

With reference to FIG. 14, the resulting workpiece is then subject to a dry etching (RIE) treatment. The 2nd metal pattern 12 (defining the source and drain conductors) and the upper planarisation layer 8 (e.g., SU-8) is resistant to the dry etching, and the dry etching stops at these layers. Accordingly, the back channel dielectric layer 52a and the light-absorbing layer 50a remain in all regions that are either occupied by the patterned photoresist 70 and/or occupied by the 2nd metal pattern 12. The first gate dielectric layer 16a and semiconductor layer 14a remain only in those regions occupied by the patterned photoresist 70. The light-absorbing material 50a thus remains, after patterning, in at least the regions of the semiconductor channels. The photoresist mask 70 is thereafter removed.

Figure 15:
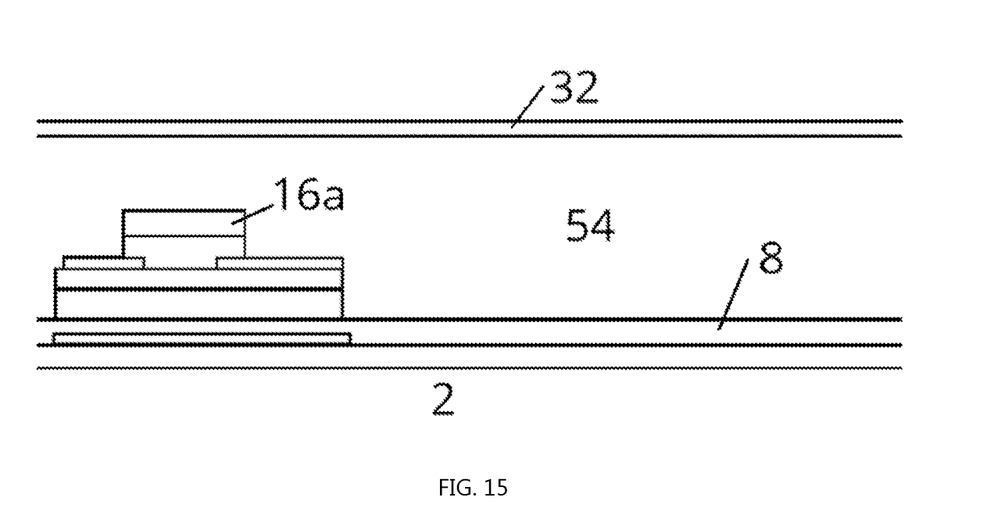
Figure 16:
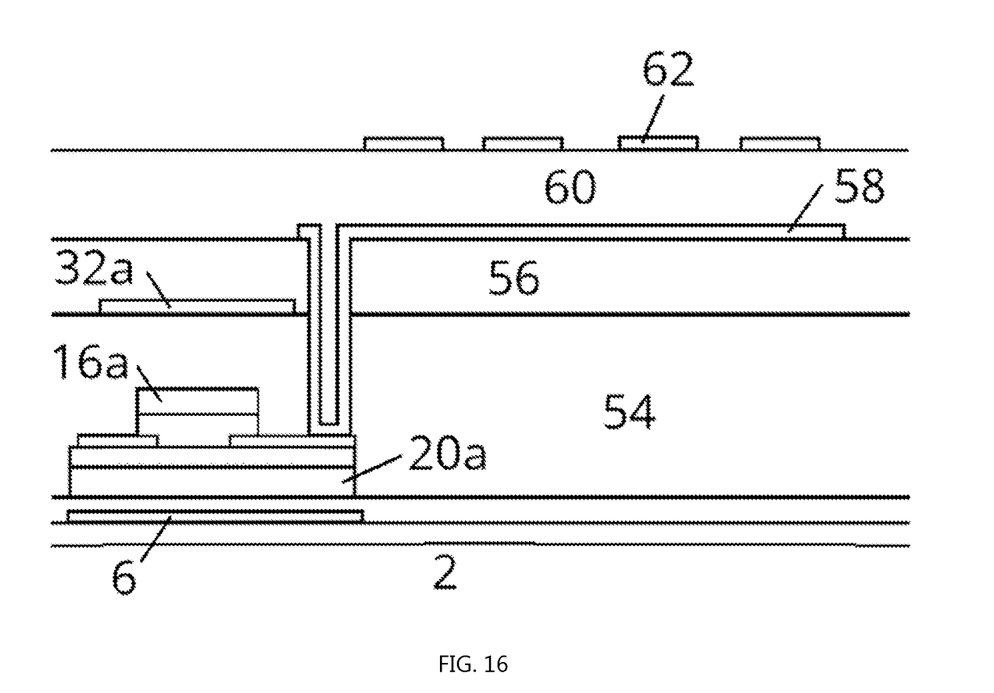

With reference to FIGS. 15 and 16, a second gate dielectric layer 54 (e.g., cross-linked organic polymer layer) is formed in situ on the working surface of the workpiece. A metal layer or sub-stack of metal layers 32 is thereafter formed in situ on the workpiece over the second gate dielectric layer 54, and patterned (using another patterned photoresist mask (not shown)) by wet etching to create a 3rd metal pattern 32a defining an array of gate conductors for the display device. The second gate dielectric layer 54 is resistant to the wet etching, and the wet etching stops at the second gate dielectric layer 54. The process continues with, in sequence: forming in situ on the workpiece an insulator (passivation) layer 56 (e.g., cross-linked organic polymer layer); patterning (by dry etching (RIE) using another patterned photoresist mask) the insulator layer 56 and the second gate dielectric layer 54 to create interconnect vias (ICVs) down to each drain conductor; forming in situ on the workpiece a conductive metal oxide pattern 58 (e.g., ITO pattern) defining an array of pixel electrodes, each in contact with a respective drain conductor through a respective ICV; forming another insulator 60 (passivation) layer (e.g., cross-linked organic polymer layer) in situ on the work piece; and forming in situ on the workpiece, over the second insulator layer, another conductive metal oxide pattern 62 defining a common counter electrode (COM electrode) for each pixel electrode 58.

In this example, the gate metal pattern 32a defines an array of conductor lines, each providing the gate electrodes for a respective row of TFTs, and extending to outside the active area occupied by the array of pixel electrodes 58. The source/drain metal pattern 12 defines an array of source conductor lines, each providing the source electrodes for a respective column of TFTs and extending to outside the active area occupied by the array of pixel electrodes. Each TFT is associated with a respective, unique combination of source conductor line and gate tracking conductive line, whereby each pixel electrode can be addressed independently of all other pixel electrodes, via conductors outside the active area.

For both the first and second example embodiments, the processes may include additional steps, such as: forming in situ on the work piece an ordered array of spacer structures for a liquid crystal cell; and thereafter forming in situ on the workpiece a liquid crystal alignment layer providing a liquid crystal alignment surface to interface with the LC material of the liquid crystal cell.

Figure 17:
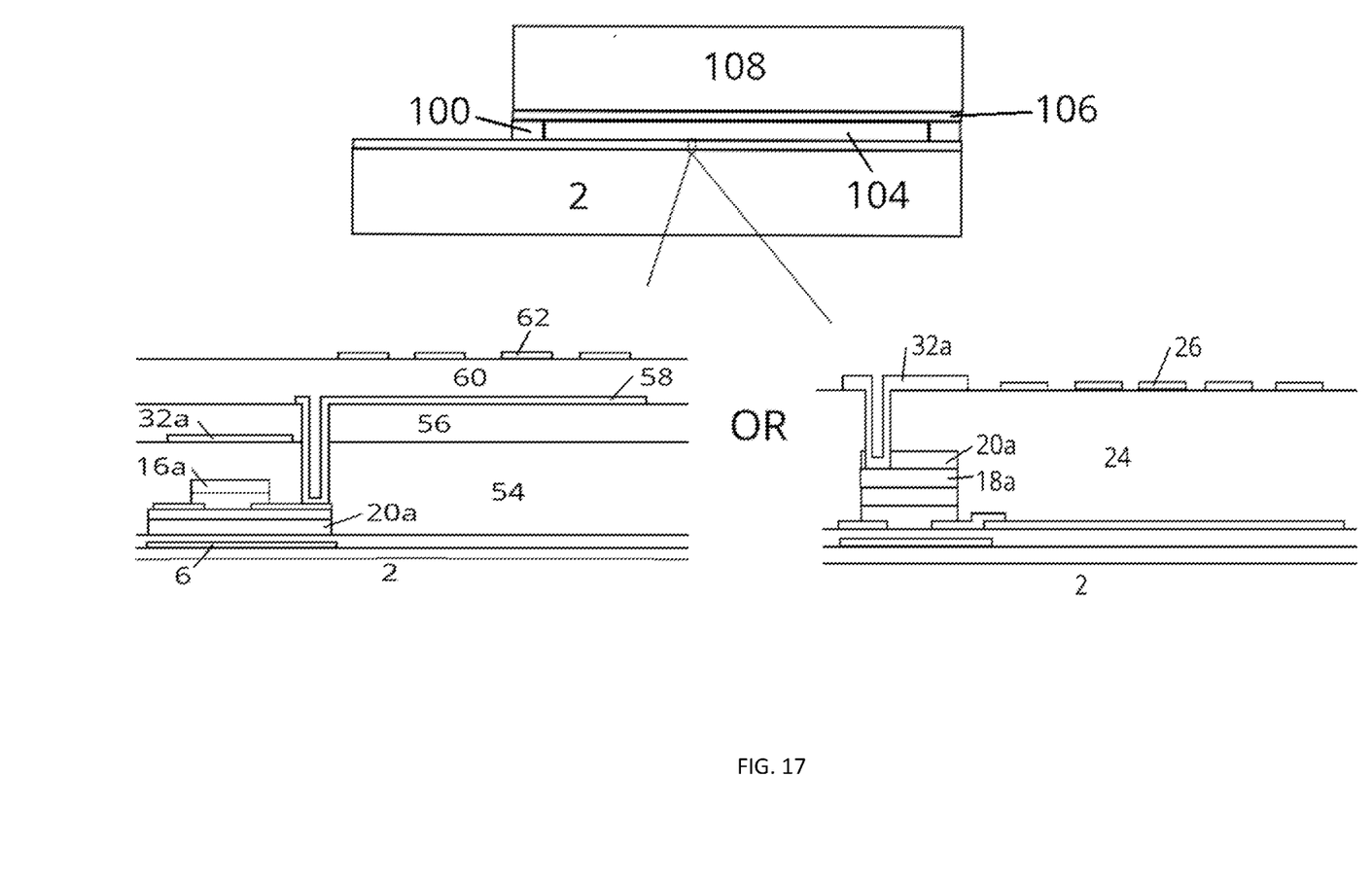
FIG. 17 illustrates one example application for the devices produced by the techniques according to the first and second embodiments.

With reference to FIG. 17, the resulting control component forms one half-cell of a liquid crystal (LC) cell for a liquid crystal colour display device. The other half-cell of the LC cell comprises a support substrate 108 (e.g., optically neutral organic polymer film such as a TAC film), and a stack of layers 106 formed in situ on the support substrate. The stack of layers 106 defines an array of colour filters in a black matrix, and a liquid crystal alignment surface that interfaces the liquid crystal material 104. The two half cells are held together by adhesive/sealant 100.

In the first and second example embodiments, the light-absorbing layer 20, 50 exhibits a white-light optical density in a direction perpendicular to the plane of the light-absorbing layer of greater than about 1. The white-light optical density is defined by ($-\log 10T$), wherein T is the white-light transmittance in a direction perpendicular to the plane of the light-absorbing layer 20, 50, and is itself defined as the fraction of white light that passes through the layer (i.e., (intensity of light measured on opposite side of layer) ÷(intensity of light incident on layer)). The light absorbing layer 20, 50 also exhibits a total reflectance of less than about 10%. The total reflectance is the sum of the specular reflectance and the diffuse reflectance. The total reflectance (and also the specular and diffuse components of the total reflectance) of the light-absorbing layer 20, 50 can be measured using an integrating sphere.

An optical density of greater than 1 and a total reflectance of less than 10% can be achieved with, e.g., a 500 nm (0.5 micron) layer of the material used for the black matrix of colour filter arrays of colour display devices. For example, the material may comprise an epoxy acrylate polymer with carbon black dispersed therein.

According to some embodiments, the light-absorbing layer 20, 50 comprises an insulator material having a sheet resistance of greater than 1 MOhm/square (i.e., $1 \times 10^6$ $\Omega$/sq).

In the first and second example embodiments, only one light-absorbing layer 20, 50 is provided, but light-absorbing layers may be provided both above and below the semiconductor channels.

As mentioned above, examples of techniques according to the present invention have been described in detail above with reference to specific process details, but the technique is more widely applicable within the general teaching of the present application. Additionally, and in accordance with the general teaching of the present invention, a technique according to the present invention may include additional process steps not described above, and/or omit some of the process steps described above.

For example, as mentioned above, the techniques are also applicable to the production of other kinds of display devices (e.g., EPD devices) and other non-display devices; and the production of other devices may involve different architectures with light-absorbing layers incorporated therein. For example, the example technique of providing a patterned light-absorbing layer between the semiconductor layer and an overlying metal layer (as in the first example embodiment) is also applicable to e.g., devices in which a single patterned metal layer provides both the gate electrodes and gate tracking for an array of TFTs.

In addition to any modifications explicitly mentioned above, it will be evident to a person skilled in the art that various other modifications of the described embodiment may be made within the scope of the invention.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features.

The invention claimed is:

1. A method, comprising:
   forming in situ on a support substrate: a first metal layer; a light-absorbing layer after the first metal layer; a conductor pattern after the light-absorbing layer; and a semiconductor layer after the conductor pattern;
   patterning the semiconductor layer using a resist mask to form a semiconductor pattern defining one or more semiconductor channels of one or more semiconductor devices; and
   patterning the light-absorbing layer using the resist mask and the conductor pattern, so as to selectively retain the light-absorbing layer in regions that are occupied by at least one of the resist mask and the conductor pattern.

2. The method according to claim 1, wherein the light-absorbing layer exhibits a white light optical density (in a direction substantially perpendicular to the plane of the support substrate) of at least about 1, and a white light total reflectance of no more than about 10%.

3. The method according to claim 1, wherein the light-absorbing layer comprises an insulator material, preferably having a sheet resistance of greater than 1 MOhm/square.

4. The method according to claim 1, wherein the light-absorbing layer is separated from the semiconductor layer by a distance (in a direction substantially perpendicular to the plane of the support substrate) of no more than about 500 nm.

5. The method according to claim 1, wherein the light-absorbing layer interfaces with the one or more semiconductor channels.

6. The method according to claim 1, wherein the first metal layer is a light-shielding metal pattern.

7. The method according to claim 1, wherein the one or more semiconductor devices form part of a control component half-cell for a liquid crystal cell comprising liquid crystal material between the control component half-cell and another half-cell comprising an array of colour filters in a black matrix.

8. The method according to claim 1, wherein patterning the semiconductor layer and patterning the light-absorbing layer comprises an etching treatment to which the semiconductor layer and the light-absorbing layer are not resistant, and to which the resist mask and conductor pattern are resistant.

9. The method according to claim 1, comprising forming a first gate dielectric layer over the semiconductor layer.

10. The method according to claim 9, comprising patterning the first gate dielectric layer using the resist mask.

11. The method according to claim 10, wherein patterning the first gate dielectric layer, patterning the semiconductor layer, and patterning the light-absorbing layer comprises an etching treatment to which none of the first gate dielectric layer, the semiconductor layer and the light-absorbing layer are resistant, and to which the resist mask and conductor pattern are resistant.

12. The method according to claim 11, comprising forming a second gate dielectric layer after patterning the first gate dielectric layer, the semiconductor layer, and the light-absorbing layer.

13. The method according to claim 12, comprising forming over the second gate dielectric layer a metal pattern defining an array of gate conductors for the one or more semiconductor devices.

14. The method according to claim 1, comprising: forming a back channel dielectric layer after forming the light-absorbing layer and before forming the conductor pattern, wherein the back channel dielectric layer interfaces with the one or more semiconductor channels.

15. The method according to claim 14, comprising patterning the back channel dielectric layer, wherein patterning the back channel dielectric layer, patterning the semiconductor layer and patterning the light-absorbing layer comprises an etching treatment to which none of the semiconductor layer, back channel dielectric layer and light-absorbing layer are resistant, and to which the resist mask and conductor pattern are resistant.

16. The method according to claim 14, comprising forming the first metal layer over a planarization layer, and wherein the back channel dielectric layer comprises a layer of a first material, and the planarization layer comprises a layer of the first material.

17. The method according to claim 1, wherein the light-absorbing layer comprises an organic polymer with inorganic light-absorbing particles dispersed therein.

18. The method according to claim 17, wherein the inorganic light-absorbing particles comprises carbon black.

19. The method according to claim 1, wherein the first metal layer primarily functions to shield the semiconductor channels from light incident on the support substrate from a side of the support substrate opposite to the first metal layer.

20. The method according to claim 1, wherein the light-absorbing layer primarily functions to absorb scattered light propagating in a direction substantially parallel to the light-absorbing layer.

* * * * *